(12) United States Patent
Ying et al.

(10) Patent No.: US 6,933,239 B2
(45) Date of Patent: Aug. 23, 2005

(54) METHOD FOR REMOVING CONDUCTIVE RESIDUE

(75) Inventors: Chentsau Ying, Cupertino, CA (US); Xiaoyi Chen, Foster City, CA (US); Chun Yan, San Jose, CA (US); Ajay Kumar, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 241 days.

(21) Appl. No.: 10/342,087

(22) Filed: Jan. 13, 2003

(65) Prior Publication Data

US 2004/0137749 A1 Jul. 15, 2004

(51) Int. Cl.[7] .............................................. H01L 21/302
(52) U.S. Cl. ........................ 438/706; 438/710; 438/714; 216/22; 134/1.1
(58) Field of Search ................................. 438/706, 710, 438/712, 714, 720; 134/1.1, 1.2, 1.3; 216/22, 58, 67

(56) References Cited

U.S. PATENT DOCUMENTS

| | | | |
|---|---|---|---|
| 4,253,907 A | * 3/1981 | Parry et al. | 438/715 |
| 6,024,885 A | * 2/2000 | Pendharkar et al. | 216/22 |
| 6,051,505 A | 4/2000 | Chu et al. | 438/710 |
| 6,242,350 B1 | 6/2001 | Tao et al. | 438/690 |
| 6,277,733 B1 | 8/2001 | Smith | 438/636 |
| 6,342,446 B1 | 1/2002 | Smith et al. | 438/687 |
| 6,355,576 B1 | * 3/2002 | Haley et al. | 438/745 |

* cited by examiner

*Primary Examiner*—Lan Vinh
(74) *Attorney, Agent, or Firm*—Moser, Patterson & Sheridan; Joseph Bach

(57) ABSTRACT

A method for removing conductive residue from a layer on a semiconductor substrate by exposing the substrate to a gas comprising a fluorine containing gas and a hydrogen containing gas. In one embodiment, the gas is excited to form a plasma that removes the conductive residue during fabrication of a magneto-resistive random access memory (MRAM) device.

10 Claims, 9 Drawing Sheets

METHOD FOR REMOVING CONDUCTIVE RESIDUE

BACKGROUND OF THE INVENTION

1. Field of the Invention

The present invention generally relates to a method for fabricating devices on semiconductor substrates. More specifically, the invention relates to a method for removing conductive residue.

2. Description of the Related Art

Microelectronic devices are generally fabricated on a semiconductor substrate as integrated circuits wherein various conductive layers are interconnected to one another to facilitate propagation of electronic signals within the device. An example of such a device is a storage element in magneto-resistive random access memories (MRAM) that facilitate storage of digital information in a form of the direction of magnetization of a magnetic material within the MRAM.

A memory cell in an MRAM device generally is a multi-layered structure comprising a pair of magnetic layers separated by a tunnel layer. More specifically, the MRAM device comprises a free (or top) magnetic layer that may change a direction of magnetization and a bottom magnetic layer that has a fixed direction of magnetization. The magnetic layers are separated by the tunnel layer formed of a non-magnetic dielectric material, such as aluminum oxide ($Al_2O_3$) and the like. The top and bottom magnetic layers may each comprise a plurality of sub-layers of magnetic materials, e.g., permalloy (NiFe), cobalt iron (CoFe), and the like. The top and bottom magnetic layers are also supplied with film electrodes (e.g., comprising tantalum (Ta), tantalum nitride (TiN), copper (Cu), and the like) to form an electrical connection for the memory cell to the lines of the MRAM.

Fabrication of a MRAM device comprises etch processes in which one or more layers comprising a MRAM film stack are removed, either partially or in total. The MRAM device comprises the layers that are generally formed from materials that may be easily oxidized, sensitive to corrosion or very thin, as well as may leave difficult to remove metal-containing post-etch residues upon the film stack. Such residues may build up along the sides of the film stack. The conductive residues or eroded layers may cause electrical short-circuits within a MRAM device, e.g., between the top and bottom magnetic layers, or may render the MRAM device to operate sub-optimally or not at all.

During etching a MRAM film stack, the conductive residues are repeatedly removed by cleaning the wafer in solvents comprising, in various combinations, hydrogen fluoride (HF), ammonium fluoride ($NH_4F$), ammonium hydroxide ($NH_4OH$), hydrogen peroxide ($H_2O_2$), and the like. Such wet cleaning processes are disclosed, for example, in commonly assigned U.S. patent applications Ser. No. 10/218,244, filed Aug. 12, 2002 and Ser. No. 10/231,620 filed Aug. 29, 2002, which are incorporated herein by reference. Disadvantages of using the wet cleaning processes to remove residues and veils produced during fabrication of the MRAM devices include low productivity of the cleaning processes, lack of real time (i.e., in situ) end point detection, as well as a need in dedicated processing equipment.

Therefore, there is a need in the art for an improved method for removing conductive residue during fabrication of a MRAM device.

SUMMARY OF THE INVENTION

The present invention is a method for removing conductive residue from a layer on a semiconductor substrate by exposing the substrate to a gas comprising a fluorine containing gas (e.g., carbon tetrafluoride ($CF_4$), nitrogen trifluoride (NF3), and the like) and a hydrogen containing gas (e.g., water ($H_2O$) vapor). In one embodiment, the gas is energized to a radio-frequency plasma that removes the post-etch conductive residue during fabrication of a magneto-resistive random access memory (MRAM) device.

BRIEF DESCRIPTION OF THE DRAWINGS

The teachings of the present invention can be readily understood by considering the following detailed description in conjunction with the accompanying drawings, in which:

FIGS. 2A–2I, together, depict a sequence of schematic, cross-sectional views of a substrate having a MRAM film stack being formed in accordance with the method of FIG. 1;

To facilitate understanding, identical reference numerals have been used, where possible, to designate identical elements that are common to the figures.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention is a method for removing conductive residue from a layer on a semiconductor substrate (e.g., silicon (Si) wafer) by exposing the substrate to a gas comprising a fluorine containing gas (e.g., carbon tetrafluoride ($CF_4$), nitrogen trifluoride (NF3), and the like) and a hydrogen containing gas (e.g., water ($H_2O$) vapor). In one embodiment, the gas is further excited (or energized) to form a plasma. In a further embodiment, the gas is energized to form a radio-frequency plasma.

In one application, the method is used to remove (or strip) the post-etch conductive residue that forms during fabrication of a magneto-resistive random access memory (MRAM) device.

Figure 1:
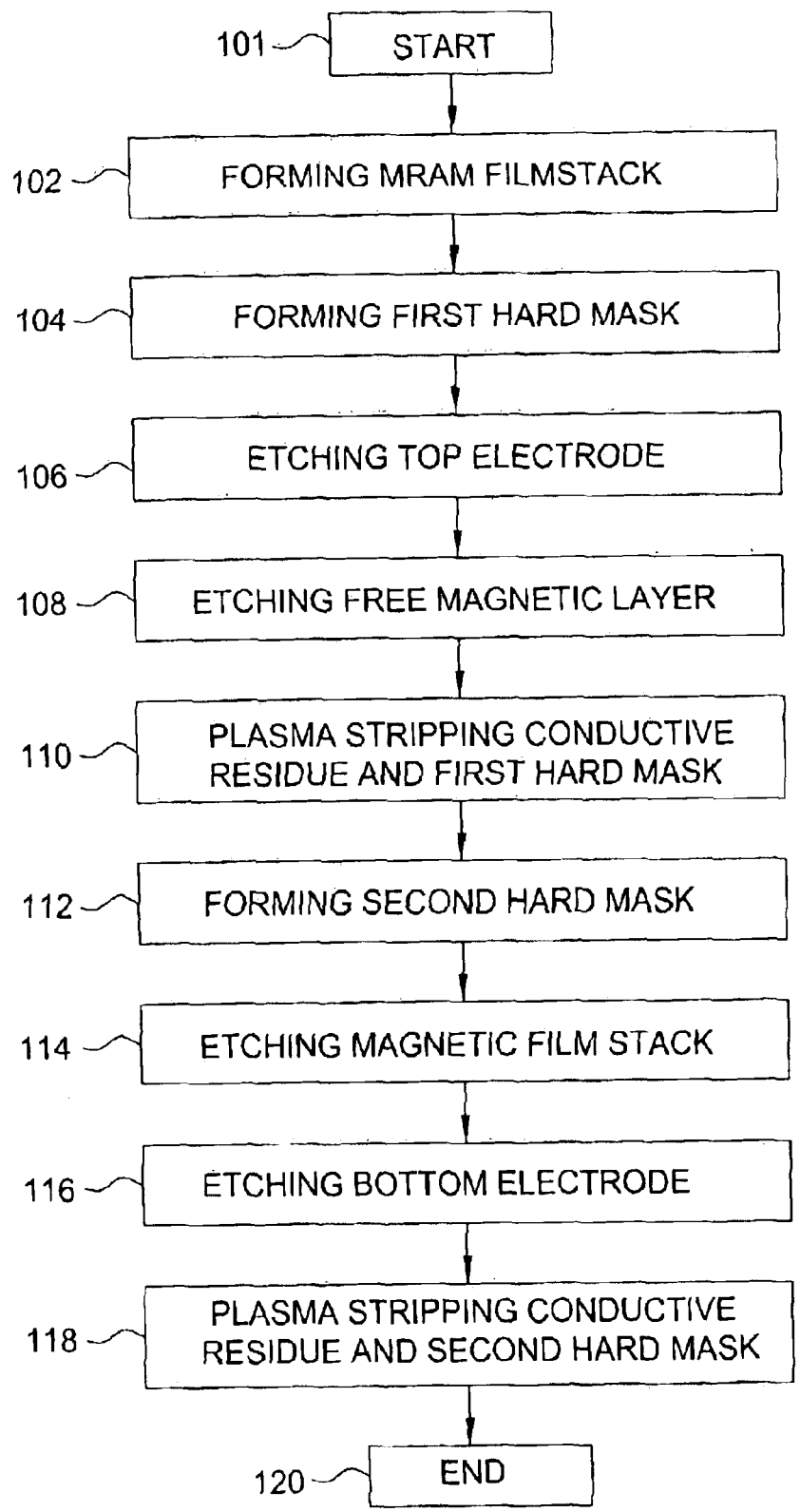
FIG. 1 depicts a flow diagram of one embodiment of a method of fabricating a MRAM film stack in accordance with the present invention.

FIG. 1 depicts a flow diagram of a method 100 of fabricating a MRAM device in accordance with the present invention. The method 100 comprises processes that are performed upon a MRAM film stack during fabrication of the MRAM device.

FIGS. 2A–2I, together, depict a sequence of schematic, cross-sectional views of a substrate having a MRAM device being formed in accordance with the method 100 of FIG. 1. The views in FIGS. 2A–2I relate to individual processing steps that are used to form the MRAM device. Sub-processes, such as lithographic processes (e.g., exposure and development of photoresist, and the like) are well known in the art and, as such, are not shown in FIG. 1 and FIGS. 2A–2I. For best understanding of the invention, the reader should refer simultaneously to FIGS. 1 and 2A–2I. The images in FIGS. 2A–2I are not depicted to scale and are simplified for illustrative purposes.

Figure 2A:
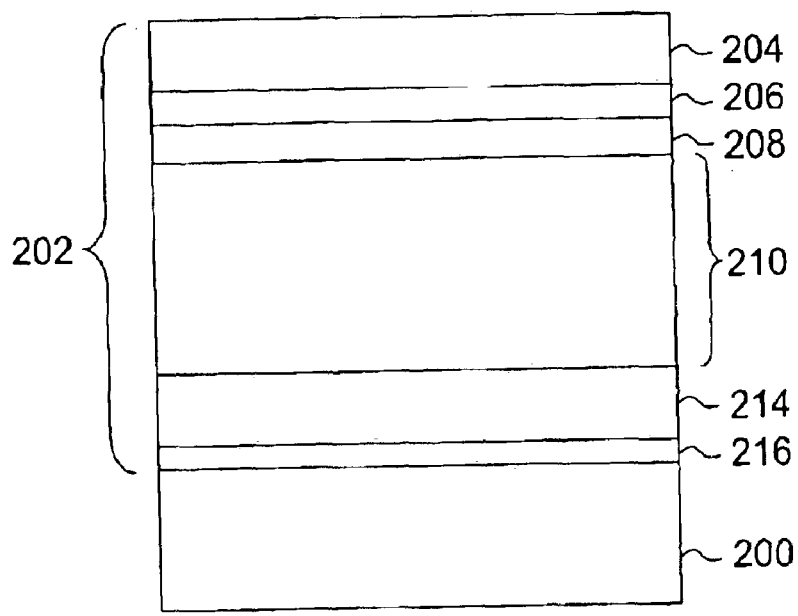

The method 100 starts at step 101 and proceeds to step 102, when a MRAM film stack 202 is formed on a wafer 200 (FIG. 2A). In one embodiment, the stack 202 comprises, from top down to the wafer 200, a top electrode layer 204, a free magnetic layer 206, a tunnel layer 208, a multi-layer magnetic stack 210, a bottom electrode layer 214, and a barrier layer 216.

In one exemplary embodiment, the top electrode 204 and bottom electrode layer 214 are formed from conductors, such as tantalum (Ta), tantalum nitride (TaN), and the like, to a thickness of about 200–600 Angstroms. The layer 206 generally comprises nickel and cobalt iron alloys, e.g., CoFe, NiFe, and the like. The layer 206 may consist of one or more films of such alloys formed to a total thickness of about 20–200 Angstroms. The tunnel layer 208 may be formed, e.g., from alumina ($Al_2O_3$) or the like dielectric material to a thickness of about 10 Angstroms. The tunnel layer 208 is sandwiched between the free magnetic layer 206 and magnetic stack 210 to form a magnetic tunnel junction of the MRAM device being fabricated. The magnetic stack 210 generally is a multi-layer film stack comprising, e.g., layers of CoFe, Ru, CoFe, PtMn or IrMn, NiFe, and NiFeCr. The barrier layer 216 generally is a dielectric layer (e.g., layer of silicon dioxide ($SiO_2$), silicon nitride ($Si_3N_4$), and the like). It should be understood, however, that the MRAM film stack 202 may comprise layers that are formed from other materials or to a different thickness.

The layers comprising the stack 202 may be deposited using a vacuum deposition technique, such as an atomic layer deposition (ALD), a physical vapor deposition (PVD), chemical vapor deposition (CVD), plasma enhanced CVD, and the like. Fabrication of the MRAM devices may be performed using, e.g., the respective processing reactors of the CENTURA® platform, ENDURA® platform, and other semiconductor wafer processing systems available from Applied Materials, Inc. of Santa Clara, Calif. and others.

Figure 2B:
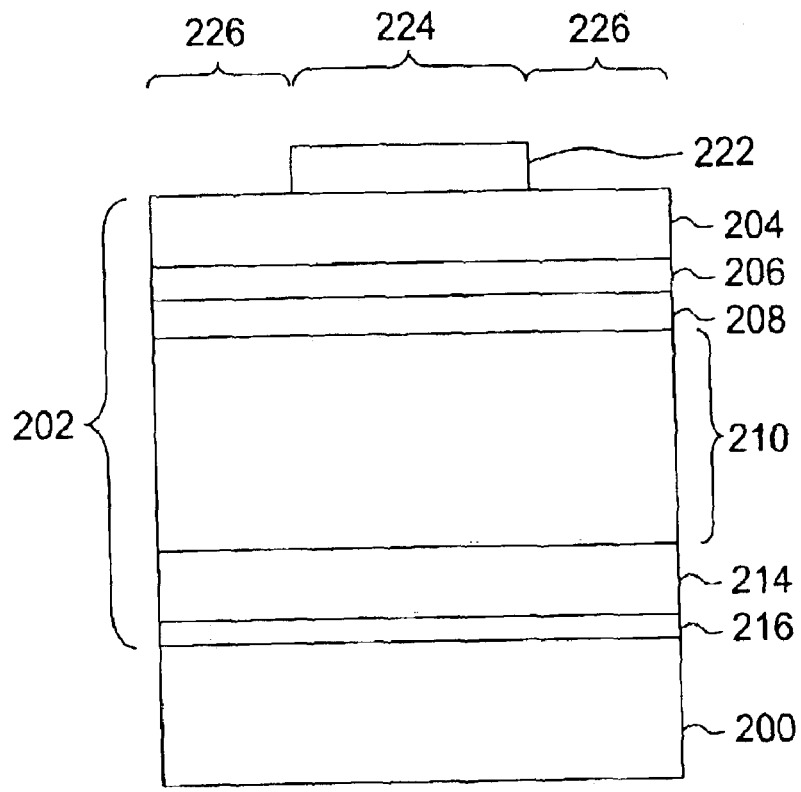

At step 104, a mask 222 is formed on the top electrode layer 204 (FIG. 2B). The mask 222 defines location and topographic dimensions of the MRAM device being fabricated using the method 100. In one embodiment, the mask 222 protects the region 224 of the MRAM film stack 202 while exposing the adjacent regions 226 of the film stack. The mask 222 generally is a patterned hard mask formed from a material that is resistant to chemistries used to etch the top electrode layer 206 and free magnetic layer 206 (discussed in reference to steps 106 and 108 below), as well as stable at the temperatures used during such etch processes.

The mask materials include, e.g., silicon dioxide ($SiO_2$), inorganic amorphous carbon (i.e., α-carbon), high-k dielectric materials (e.g. hafnium dioxide ($HfO_2$), $HfSiO_2$, and the like), and the like. Alternatively, the mask 222 may be formed from photoresist. Processes of applying various masks are described, e.g., in U.S. patent applications Ser. No. 10/218,244, filed Aug. 12, 2002 and Ser. No. 10/231,620 filed Aug. 29, 2002, and in commonly assigned U.S. patent application Ser. No. 09/590,322, filed Jun. 8, 2000, which is incorporated herein by reference. In one illustrative embodiment, the mask 222 is formed from silicon dioxide to a thickness of about 300 to 2000 Angstroms.

Figure 2C:
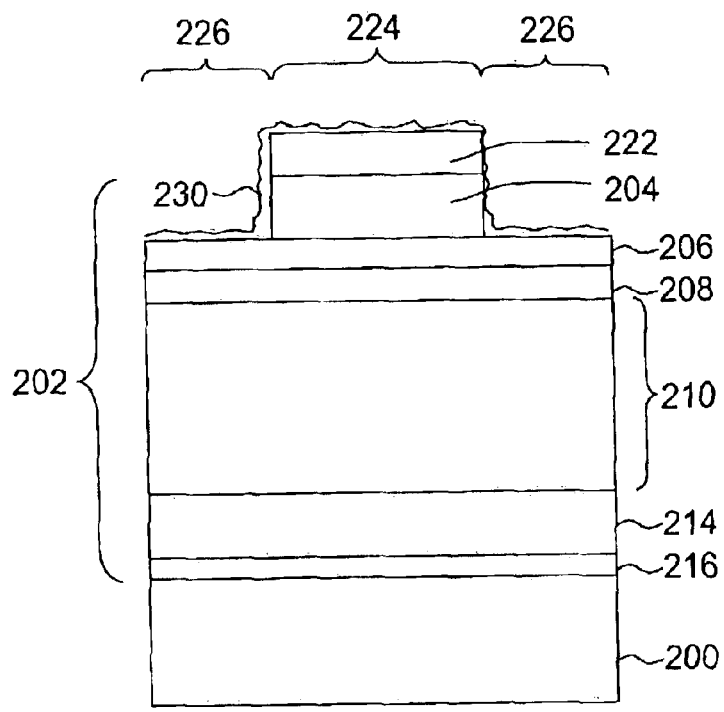

At step 106, the top electrode layer 204 is plasma etched and removed in the regions 226 (FIG. 2C). Generally, step 106 uses a fluorine-based chemistry (e.g., comprising carbon tetrafluoride ($CF_4$), trifluoromethane ($CHF_3$), and the like) or a chlorine-based chemistry (e.g., comprising chlorine ($Cl_2$), hydrogen chloride (HCl), and the like), as well as a diluent gas, such as argon (Ar) (FIG. 3C). Step 106 uses the mask 222 (e.g., $SiO_2$ mask) as an etch mask and may use the free magnetic layer 206 as an etch stop layer (e.g., an endpoint detection system of the etch reactor may monitor plasma emissions at a particular wavelength to determine that the top electrode layer 204 has been removed in the regions 226).

Step 106 can be performed, e.g., in a Decoupled Plasma Source (DPS I) of the CENTURA® system. The DPS I reactor (described in reference to FIG. 4 below) uses an inductive source to produce a high-density plasma and a source of RF power to bias the wafer.

In one illustrative embodiment, during etching the top electrode layer 204 in the DPS I reactor, step 106 provides carbon tetrafluoride at a rate of 40 to 80 sccm and trifluoromethane at a rate of 10 to 30 sccm (i.e., a $CF_4$:$CHF_3$ flow ratio ranging from 4:3 to 8:1), as well as argon at a rate of 40 to 80 sccm, applies 200 to 3000 W of plasma power and 0 to 300 W of bias power, and maintains a wafer temperature at 0 to 250 degrees Celsius and a pressure in the reaction chamber at 5 to 40 mTorr. One exemplary process provides $CF_4$ at a rate of 60 sccm, $CHF_3$ at a rate of 20 sccm (i.e., a $CF_4$:$CHF_3$ flow ratio of about 3:1), Ar at a rate of 60 sccm, 1000 W of plasma power, 50 W of bias power, a wafer temperature of 80 degrees Celsius, and a pressure of 10 mTorr.

Step 106 develops metal-containing (e.g., comprising tantalum) conductive residue 230 that, however, may stay during the next step (step 108) of the method 100.

Figure 2D:
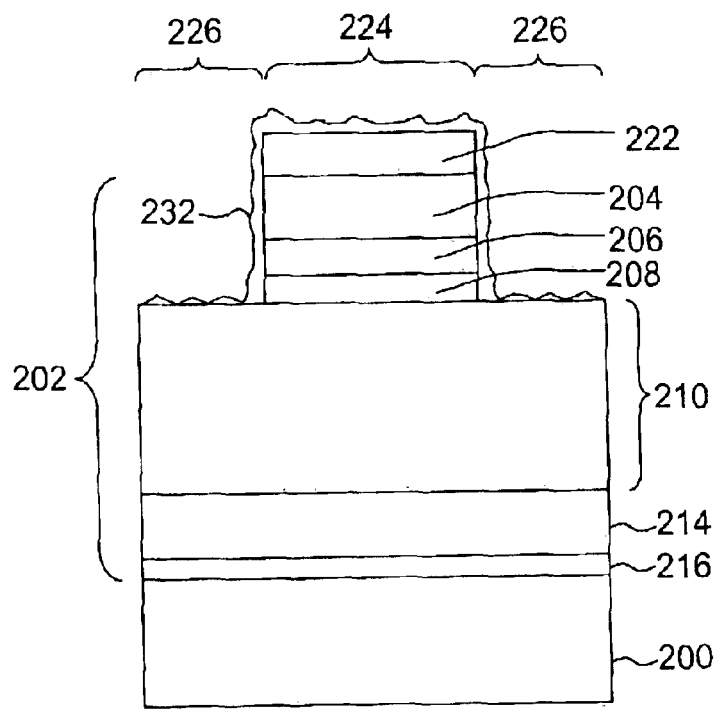

At step 108, the free magnetic layer 206 is plasma etched and removed in the regions 226 using, e.g., an oxygen and chlorine based chemistry (FIG. 2D). Step 108 may use the alumina tunnel layer 208 as an etch stop layer.

Similar to step 106, step 108 can be performed, e.g., in the DPS I reactor. In one illustrative embodiment, step 108 provides oxygen ($O_2$) at a rate of 10 to 50 sccm and chlorine ($Cl_2$) at a rate of 10 to 100 sccm (corresponds to a $O_2$:$Cl_2$ flow ratio ranging from 1:10 to 5:1), as well as argon at a rate of 10 to 100 sccm, applies 200 to 3000 W of plasma power and 0 to 300 W of bias power, and maintains a wafer temperature at 15 to 80 degrees Celsius and a pressure in the reaction chamber at 1 to 20 mTorr. One exemplary process provides $O_2$ at a rate of 40 sccm, $Cl_2$ at a rate of 20 sccm (i.e., a $O_2$:$Cl_2$ flow ratio of about 2:1), Ar at a rate of 20 sccm, 700 W of plasma power, 100 W of bias power, a wafer temperature of 40 degrees Celsius, and a pressure of 5 mTorr.

During step 108, metals (e.g., Co, Fe, Ni, and the like) etched from the free magnetic layer 206 combine with components of the etchant gas and by-products of the etch process to form conductive residue. Such residue combines with the residue 230 (i.e., residue remaining after step 106) to form a residue 232. After step 108, the residue 232 may be found on sidewalls of the layers 204 and 206, on the mask 222, and elsewhere on the wafer 200. The residue 232 is a contaminant with respect to further fabrication of the MRAM device and, as such, should be removed before the method 100 continues.

Figure 2E:
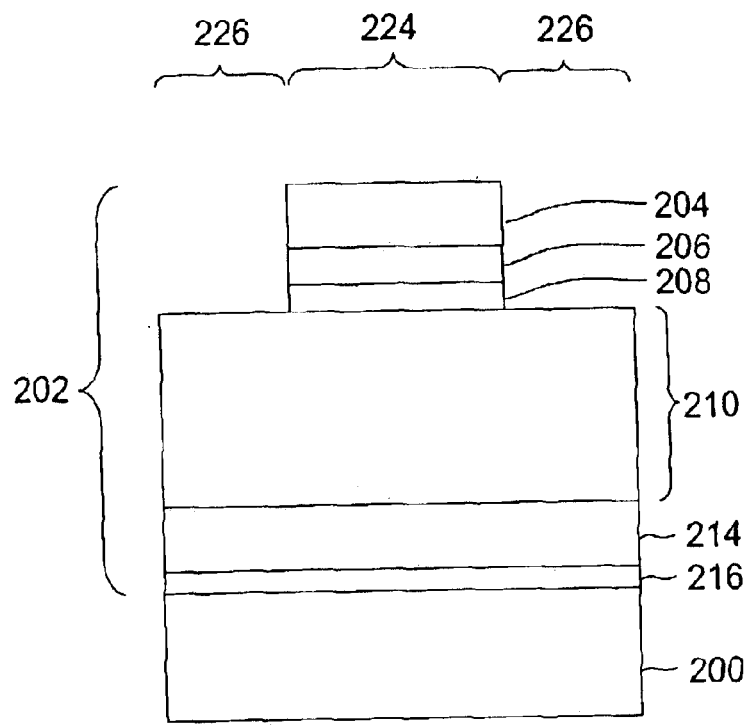

At step 110, the conductive residue 232 is stripped using a gas comprising a fluorine-based chemistry (e.g., comprising at least one of carbon tetrafluoride ($CF_4$) and nitrogen trifluoride ($NF_3$), and the like) and at least one of water ($H_2O$) vapor and ammonia ($NH_3$) (FIG. 2E). In one embodiment, the gas is energized to form a plasma. In a further embodiment, the gas is energized to form a radio-frequency plasma. In an alternative embodiment, the gas may be energized to form a microwave plasma.

In one embodiment, step 110 contemporaneously strips the $SiO_2$ mask 222. In a further embodiment, the stripping process is used to etch and remove the tunnel layer 208 in the regions 226 using an upper film of the stack 202 (e.g., CoFe layer) as an etch stop layer. The residue stripping process can be performed, for example, in an AXIOM® reactor of the CENTURA® system. The AXIOM® reactor is described in detail in U.S. patent application Ser. No. 10/264,664, filed Oct. 4, 2002, which is herein incorporated by reference. The salient features of the AXIOM® reactor are briefly described below in reference to FIG. 3.

The AXIOM® reactor is a remote plasma reactor in which the radio-frequency plasma is confined such that only reactive neutrals are allowed to enter a reaction volume of the process chamber. Such confinement scheme precludes plasma-related damage of the substrate or circuits formed on the substrate. In the AXIOM® reactor, a wafer backside may be heated radiantly by quartz halogen lamps or cooled using the backside gas, such that the wafer temperature can be maintained at 20 to 450 degrees Celsius. Similar to the referred to above DPS I reactor, the AXIOM® reactor may use an endpoint detection system.

Using the AXIOM® reactor, step 110 provides a source of fluorine and a source of hydrogen to the wafer. In one illustrative embodiment, the source of fluorine is carbon tetrafluoride supplied at a rate of 50 to 500 sccm (or nitrogen trifluoride at a rate of 50 to 500 sccm) and the source of hydrogen is water vapor supplied at a rate of 50 to 500 sccm (i.e., a $CF_4$:$H_2O$ flow ratio ranging from about 1:10 to 10:1). Further, step 110 applies 1000 to 2000 W of power at about 200 to 600 kHz to form the remote plasma and maintains a wafer temperature at 20 to 400 degrees Celsius and gas pressure in the process chamber at 1 to 5 Torr.

One exemplary process provides 250 sccm of $CF_4$ and 250 sccm of $H_2O$ (i.e., a $CF_4$:$H_2O$ flow ratio of about 1:1), 1400 W of plasma power, a wafer temperature of 200 degrees Celsius, and a pressure of 2 Torr. The process provides selectivity to $SiO_2$ (mask 222) over $Al_2O_3$ (layer 208) of about 100:1.

Figure 2F:
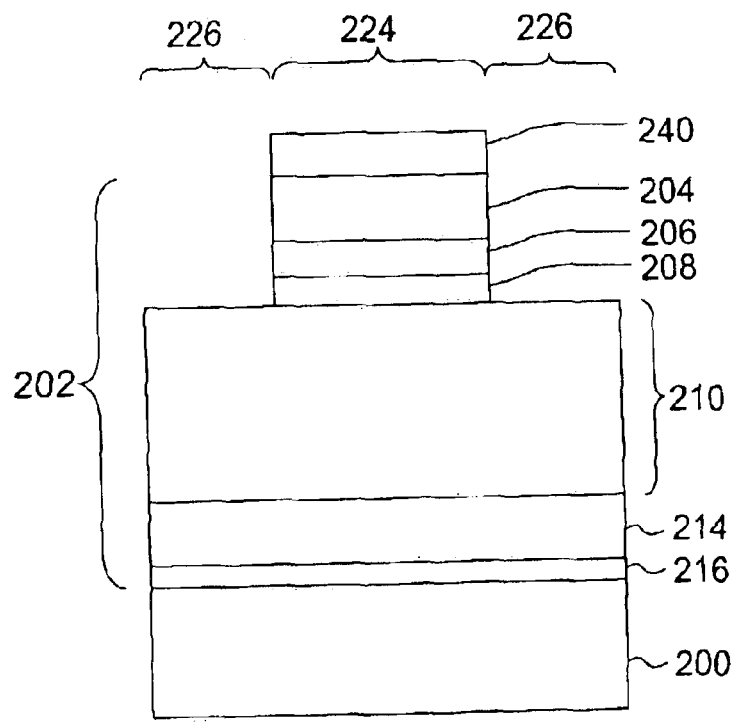

At step 112, a second mask 240 is formed on the MRAM film stack 202 (FIG. 2F). The mask 240 generally is a hard mask that is formed from a material resistant to the chemistries used to etch the magnetic stack 210 and bottom electrode layer 214 (discussed in reference to steps 114 and 116 below), as well as stable at the temperatures used during such etch processes. Similar to mask 222, in an alternative embodiment, the mask 240 may be formed from photoresist. In one illustrative embodiment, the mask 240 is formed from silicon dioxide to a thickness of about 600 to 200 Angstroms. In the depicted embodiment, the mask 240 replaces the mask 222 on the top electrode 202. In an alternative embodiment (not shown), the mask 240 may be formed to protect a region wider than that defined by the top electrode 202.

Figure 2G:
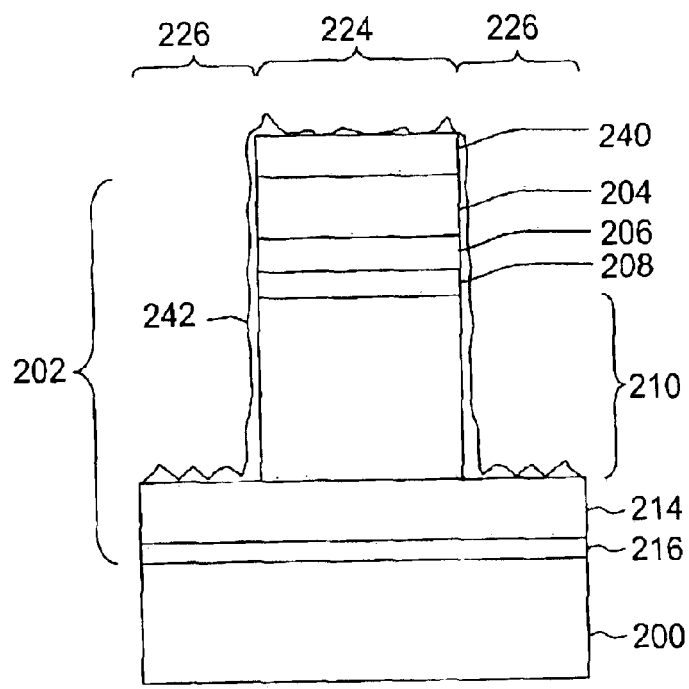

At step 114, the magnetic film stack 210 is plasma etched and removed in the regions 226 using, e.g., a boron chloride ($BCl_3$) based chemistry (FIG. 2G). Step 114 may use the bottom electrode layer 214 as an etch stop layer.

Step 114 can be performed, e.g., in the DPS I reactor. In one illustrative embodiment, step 114 provides boron chloride at a rate of 5 to 20 sccm and argon at a rate of 20 to 80 sccm (i.e., a $BCl_3$:Ar flow ratio ranging from 1:16 to 1:1), applies 200 to 3000 W of plasma power and 0 to 300 W of bias power, and maintains a wafer temperature at 15 to 80 degrees Celsius and a pressure in the reaction chamber at 5 to 20 mTorr. One exemplary process provides $BCl_3$ at a rate of 20 sccm, Ar at a rate of 80 sccm (i.e., a $BCl_3$:Ar flow ratio of about 1:4), 700 W of plasma power, 150 W of bias power, a wafer temperature of 80 degrees Celsius, and a pressure of 5 mTorr.

Similar to step 108, during step 114, by-products of the etch process may produce a conductive residue 242. The residue 242 generally deposits on the sidewalls of the film stack 202, on the mask 240, as well as elsewhere on the wafer 200. Such residue contains atoms of metals composing the magnetic film stack 210. Nevertheless, presence of the residue 242 is not detrimental to performing the next step (step 116) of the method 100.

Figure 2H:
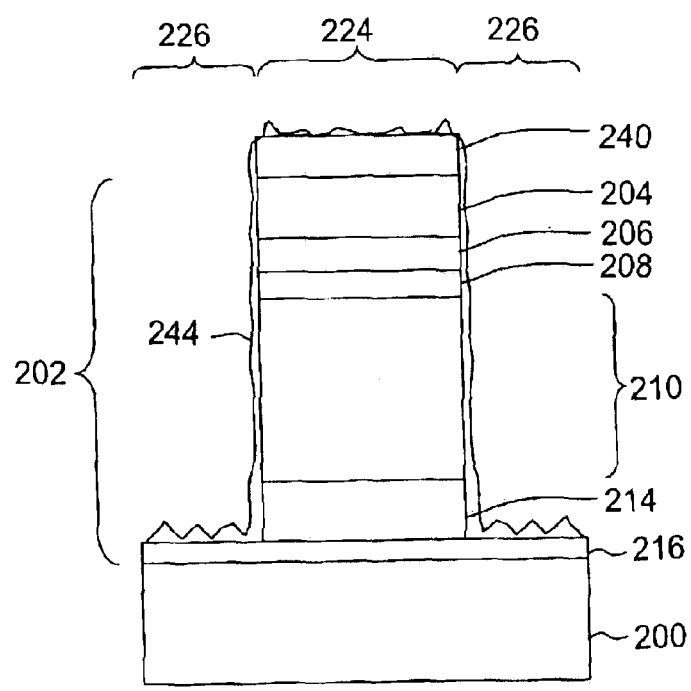
Figure 21:
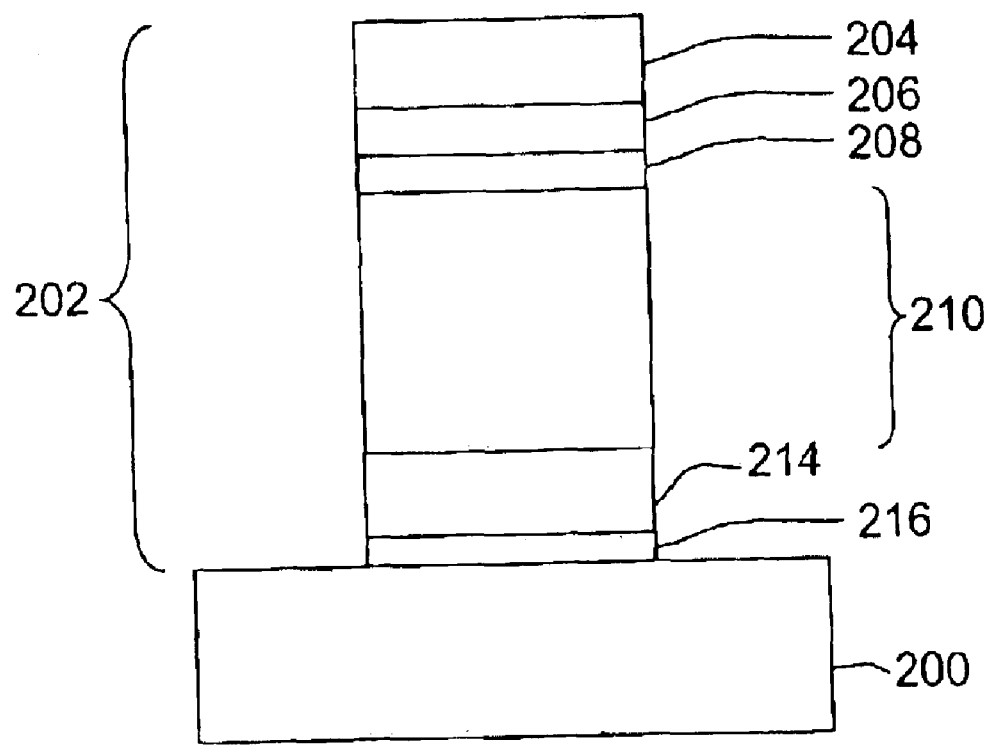

At step 116, the bottom electrode layer 214 is plasma etched and removed in the regions 226 using, e.g., a chlorine-based chemistry (FIG. 2H). Step 114 may use the barrier layer 216 (e.g., $SiO_2$, silicon nitride ($Si_3N_4$), and the like) as an etch stop layer.

Similar to step 114, step 116 can be performed, e.g., in the DPS I reactor. In one illustrative embodiment, step 116 provides chlorine at a rate of 10 to 100 sccm and argon at a rate of 10 to 100 sccm (i.e., a $Cl_2$:Ar flow ratio ranging from 1:10 to 10:1), applies 200 to 3000 W of plasma power and 0 to 300 W of bias power, and maintains a wafer temperature at 15 to 80 degrees Celsius and a pressure in the reaction chamber at 5 to 40 mTorr. One exemplary etch process provides $Cl_2$ at a rate of 45 sccm, Ar at a rate of 45 sccm (i.e., a $Cl_2$:Ar flow ratio of about 1:1), 700 W of plasma power, 75 W of bias power, a wafer temperature of 80 degrees Celsius, and a pressure of 10 mTorr.

In an alternative embodiment, steps 114 and 116 may be performed contemporaneously using, e.g., a chlorine-based chemistry (e.g., $Cl_2$/Ar chemistry and the like).

Step 116 develops metal-containing (e.g., comprising tantalum) conductive residue that combines with the residue 242 to form a residue 244. The residue 244 may short-circuit the free magnetic layer 206 and the magnetic film stack 210. As such, the residue 244 should be removed prior to completion of the process 100.

At step 118, the conductive residue 244 is stripped using a gas comprising a fluorine-based chemistry and at least one of water vapor and ammonia and energized to form a plasma (FIG. 2I). Step 118 can be performed using the AXIOM® reactor and may use a process recipe described in reference to step 110. Similar to step 110, in the depicted embodiment, step 118 contemporaneously strips the silicon dioxide mask 240. In one further embodiment, step 118 also removes the barrier layer 216 (e.g., silicon dioxide layer), as illustratively depicted in FIG. 2I.

At step 120, the method 100 ends.

The MRAM device operates by applying a voltage across the electrodes 204 and 214 to set the direction of the magnetic moments in the free magnetic layer 206. The layer of PtMn is a "pinning" layer that sets (or pins) the direction of the magnetic moments of the magnetic film stack 210 (the "pinned" layer). Depending on whether the direction of moments in the free magnetic layer 206 is aligned with the direction of the pinned layer 210 or is opposed to the direction of the magnetic moments in the pinned layer 210, the electrical current through the MRAM device is either high or low. The establishment of the moment direction in the free magnetic layer 206 is used to store information in an MRAM cell. A plurality of the cells can be arranged to form a MRAM memory array.

Figure 3:
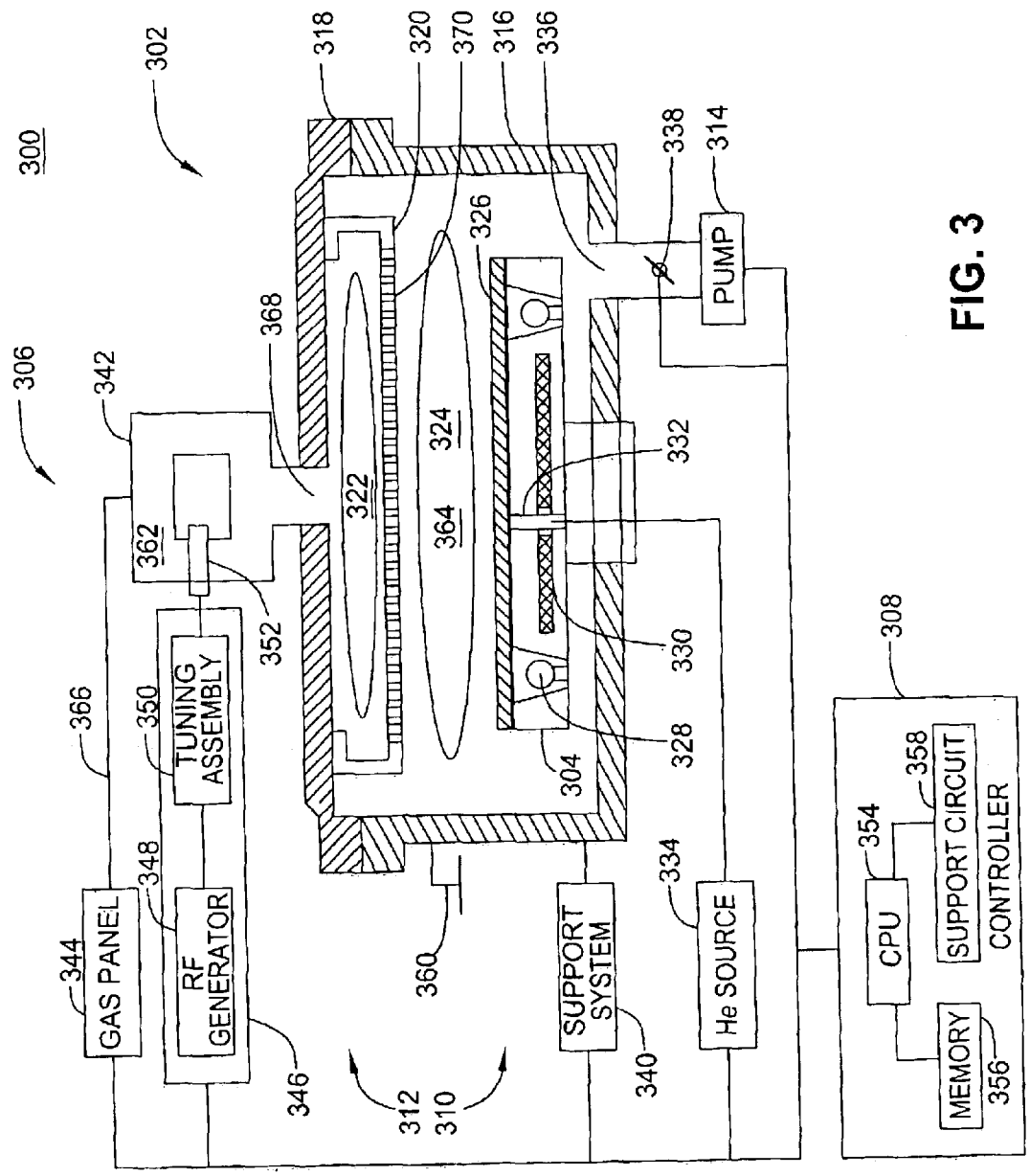
FIG. 3 depicts a schematic diagram of an exemplary plasma apparatus of the kind used in performing portions of the method of FIG. 1.

FIG. 3 depicts a schematic diagram of the AXIOM® reactor 300 that may be used to practice portions of the method 100. The reactor 300 comprises a process chamber 302, a remote plasma source 306, and a controller 308.

The process chamber 302 generally is a vacuum vessel, which comprises a first portion 310 and a second portion 312. In one embodiment, the first portion 310 comprises a substrate pedestal 304, a sidewall 316 and a vacuum pump 314. The second portion 312 comprises a lid 318 and a gas distribution plate (showerhead) 320, which defines a gas mixing volume 322 and a reaction volume 324. The lid 318 and sidewall 316 are generally formed from a metal (e.g., aluminum (Al), stainless steel, and the like) and electrically coupled to a ground reference 360.

The substrate pedestal 304 supports a substrate (wafer) 326 within the reaction volume 324. In one embodiment, the substrate pedestal 304 may comprise a source of radiant heat, such as gas-filled lamps 328, as well as an embedded resistive heater 330 and a conduit 332. The conduit 332 provides a gas (e.g., helium) from a source 334 to the backside of the wafer 326 through grooves (not shown) in the wafer support surface of the pedestal 304. The gas facilitates heat exchange between the support pedestal 304 and the wafer 326. The temperature of the wafer 326 may be controlled between about 20 and 400 degrees Celsius.

The vacuum pump 314 is adapted to an exhaust port 336 formed in the sidewall 316 of the process chamber 302. The vacuum pump 314 is used to maintain a desired gas pressure in the process chamber 102, as well as evacuate the post-processing gases and other volatile compounds from the chamber. In one embodiment, the vacuum pump 314 comprises a throttle valve 338 to control a gas pressure in the process chamber 302.

The process chamber 302 also comprises conventional systems for retaining and releasing the wafer 326, detecting an end of a process, internal diagnostics, and the like. Such systems are collectively depicted in FIG. 1 as support systems 340.

The remote plasma source 306 comprises a power source 346, a gas panel 344, and a remote plasma chamber 342. In one embodiment, the power source 346 comprises a radio-frequency (RF) generator 348, a tuning assembly 350, and an applicator 352. The RF generator 348 is capable of producing of about 200 to 3000 W at a frequency of about 200 to 600 kHz. The applicator 352 is inductively coupled to the remote plasma chamber 342 and energizes a process gas (or gas mixture) 364 to a plasma 362 in the chamber. In this embodiment, the remote plasma chamber 342 has a toroidal geometry that confines the plasma and facilitates efficient generation of radical species, as well as lowers the electron temperature of the plasma. In other embodiments, the remote plasma source 306 may be a microwave plasma source, however, the stripping rates are generally higher using the inductively coupled plasma.

The gas panel 344 uses a conduit 366 to deliver the process gas 364 to the remote plasma chamber 342. The gas panel 344 (or conduit 366) comprises means (not shown), such as mass flow controllers and shut-off valves, to control gas pressure and flow rate for each individual gas supplied to the chamber 342. In the plasma 362, the process gas 364 is ionized and dissociated to form reactive species.

The reactive species are directed into the mixing volume 322 through an inlet port 368 in the lid 318. To minimize charge-up plasma damage to devices on the wafer 326, the ionic species of the process gas 364 are substantially neutralized within the mixing volume 322 before the gas reaches the reaction volume 324 through a plurality of openings 370 in the showerhead 320.

The controller 308 comprises a central processing unit (CPU) 354, a memory 356, and a support circuit 358. The CPU 354 may be of any form of a general-purpose computer processor used in an industrial setting. Software routines can be stored in the memory 356, such as random access memory, read only memory, floppy or hard disk, or other form of digital storage. The support circuit 358 is conventionally coupled to the CPU 354 and may comprise cache, clock circuits, input/output sub-systems, power supplies, and the like.

The software routines, when executed by the CPU 354, transform the CPU into a specific purpose computer (controller) 308 that controls the reactor 300 such that the processes are performed in accordance with the present invention. The software routines may also be stored and/or executed by a second controller (not shown) that is located remotely from the reactor 300.

Figure 4:
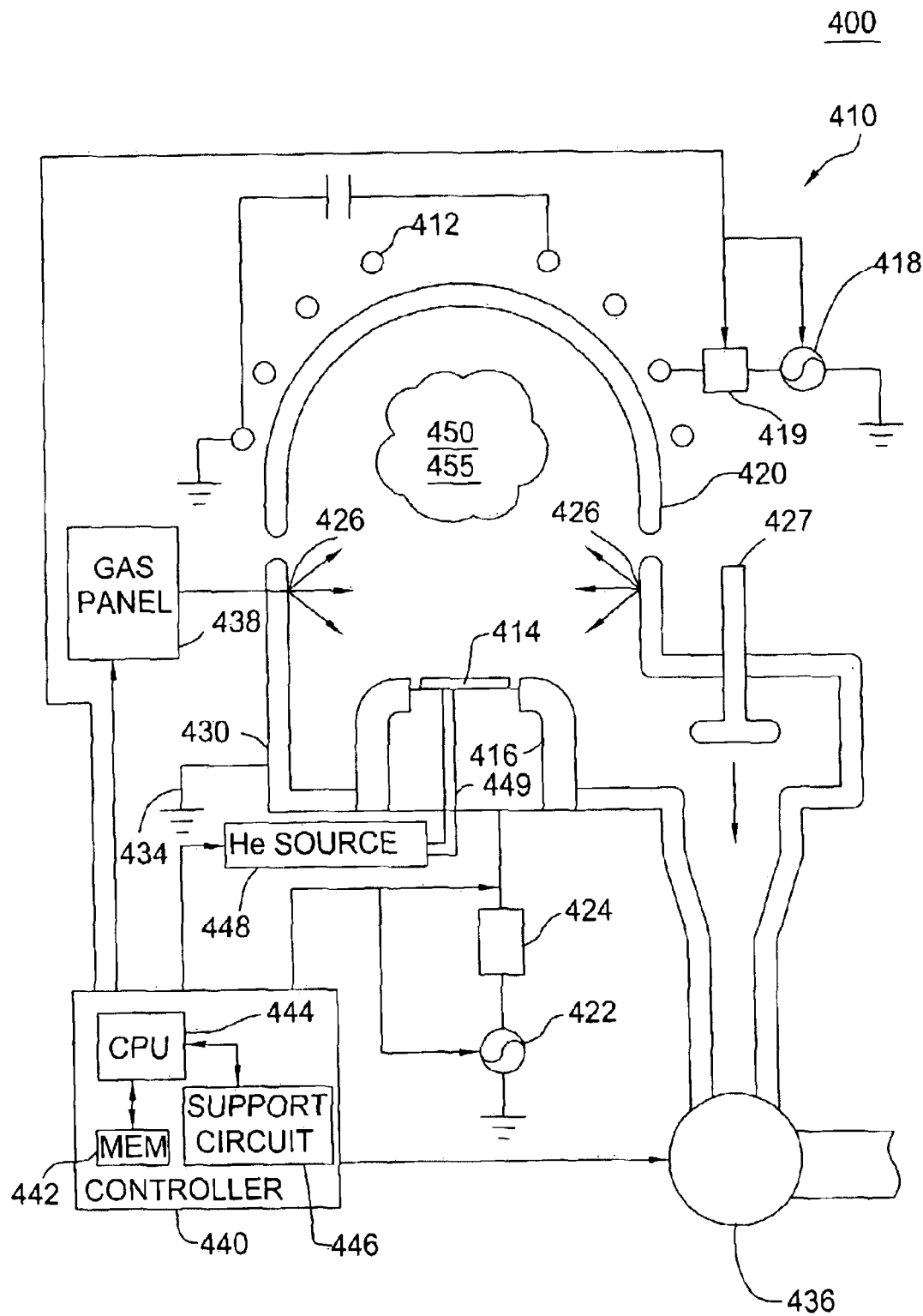
FIG. 4 depicts a schematic diagram of an exemplary plasma etch apparatus of the kind used in performing portions of the method of FIG. 1.

FIG. 4 depicts a schematic diagram of a DPS I etch reactor 400 that may be used to practice portions of the inventive method. The reactor 400 comprises a process chamber 410 having a wafer support pedestal 416 within a conductive body (wall) 430, and a controller 440.

The support pedestal (cathode) 416 is coupled, through a first matching network 424, to a biasing power source 422. The biasing source 422 generally is a source of up to 500 W at a frequency of approximately 13.56 MHz that is capable of producing either continuous or pulsed power. In other embodiments, the source 422 may be a pulsed AC source. The chamber 410 is supplied with a dome-shaped dielectric ceiling 420. Other modifications of the chamber 410 may have other types of ceilings, e.g., a substantially flat ceiling. Above the ceiling 420 is disposed an inductive coil antenna 412. The antenna 412 is coupled, through a second matching network 419, to a plasma power source 418. The plasma source 418 typically is capable of producing up to 3000 W at a tunable frequency in a range from 50 kHz to 13.56 MHz. Typically, the wall 430 is coupled to an electrical ground 434.

A controller 440 comprises a central processing unit (CPU) 444, a memory 442, and support circuits 446 for the CPU 444 and facilitates control of the components of the chamber 410 and, as such, of the processes performed to accomplish the present invention, as discussed below in further detail.

In operation, a semiconductor wafer 414 is placed on the pedestal 416 and process gases are supplied from a gas panel 438 through entry ports 426 and form a gaseous mixture 450. The gaseous mixture 450 is ignited into a plasma 455 in the chamber 410 by applying power from the plasma and bias sources 418 and 422 to the antenna 412 and the cathode 416, respectively. The pressure within the interior of the chamber 410 is controlled using a throttle valve 427 and a vacuum pump 436. The temperature of the chamber wall 430 is controlled using liquid-containing conduits (not shown) that run through the wall 430.

The temperature of the wafer 414 is controlled by stabilizing a temperature of the support pedestal 416. In one embodiment, the helium gas from a gas source 448 is provided via a gas conduit 449 to channels formed by the back of the wafer 414 and grooves (not shown) in the pedestal surface. The helium gas is used to facilitate heat transfer between the pedestal 416 and the wafer 414. During the processing, the pedestal 416 may be heated by a resistive heater (not shown) within the pedestal to a steady state temperature and then the helium gas facilitates uniform heating of the wafer 414. Using such thermal control, the wafer 414 is maintained at a temperature of between 0 and 500 degrees Celsius.

Those skilled in the art will understand that other forms of chambers may be used to practice the invention, including chambers with remote plasma sources, microwave plasma chambers, electron cyclotron resonance (ECR) plasma chambers, and the like.

To facilitate control of the process chamber 410 as described above, the controller 440 may be one of any form of general-purpose computer processor that can be used in an industrial setting for controlling various chambers and sub-processors. The memory, or computer-readable medium, 442 of the CPU 444 may be one or more of readily available memory such as random access memory (RAM), read only memory (ROM), floppy disk, hard disk, or any other form of digital storage, local or remote. The support circuits 446 are coupled to the CPU 444 for supporting the processor in a conventional manner. These circuits include cache, power supplies, clock circuits, input/output circuitry and subsystems, and the like. The inventive method is generally stored in the memory 442 as software routine. The software routine may also be stored and/or executed by a second CPU (not shown) that is remotely located from the hardware being controlled by the CPU 444.

Figure 5:
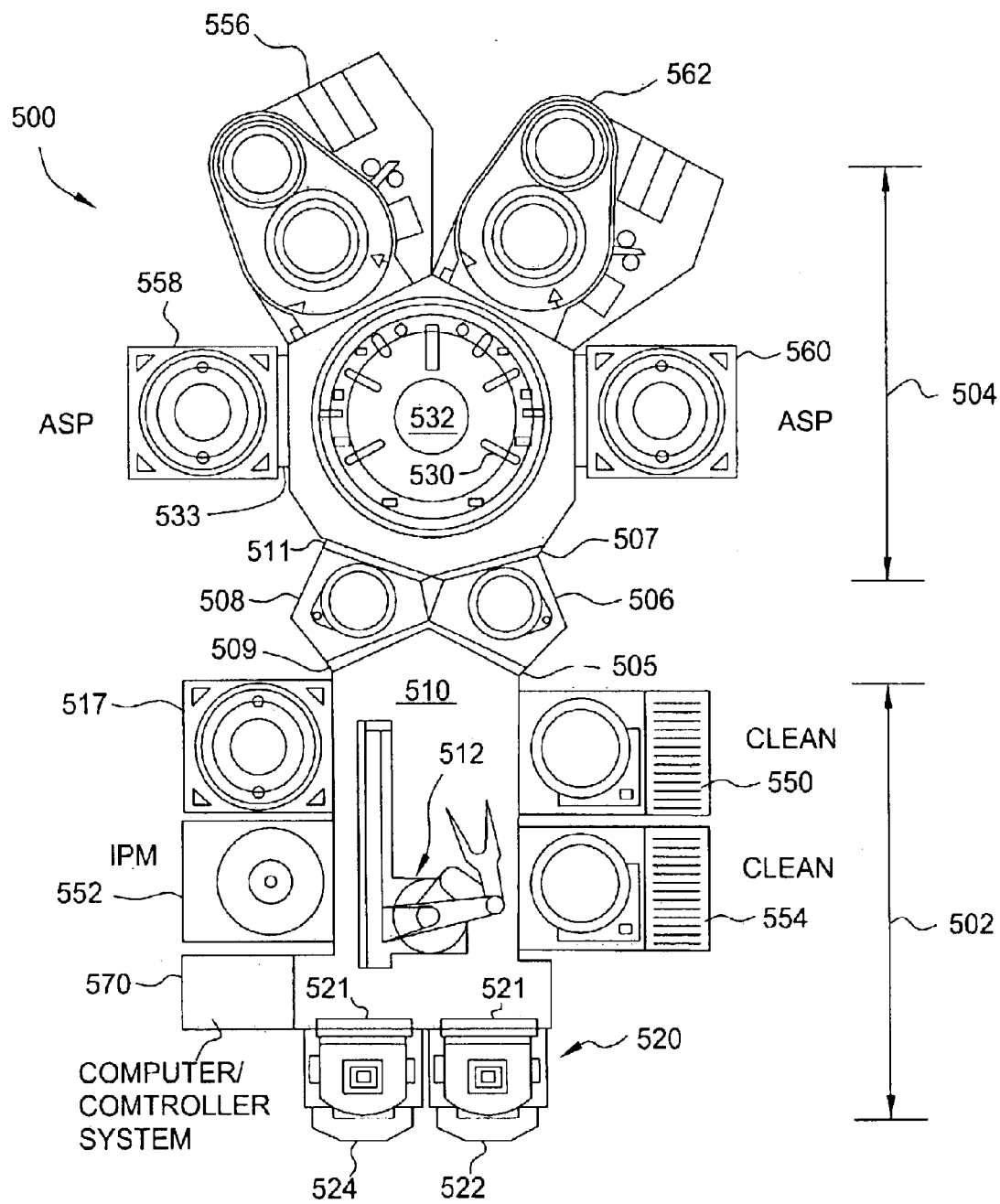
FIG. 5 depicts a schematic, plan view of a processing platform integrating the apparatuses of FIGS. 3 and 4 used in performing the method of the present invention.

The portions of the present invention are illustratively performed on a processing platform 500 shown in FIG. 5 that comprises reactors for performing both atmospheric and sub-atmospheric processing. The platform 500 and the various modules and tools that can be used with such a platform are described in detail in U.S. patent application Ser. No. 09/945,454, filed Aug. 31, 2001, which is herein incorporated by reference. The salient features of the processing platform 500 are briefly described below.

Depending upon the process modules that are used in the platform 500, the platform 500 (also referred to as a process tool) can be used to perform etching, oxidation, substrate cleaning, photoresist stripping, substrate inspection and the like. The platform 500 comprises an atmospheric platform 502 and a sub-atmospheric platform 504. The sub-atmospheric platform 504 and the atmospheric platform 502 may be coupled together by a single substrate load lock 506 or, as shown in the depicted example, are coupled together by a pair of single load locks 506 and 508. In some applications, the sub-atmospheric and atmospheric platforms 504 and 502 are not coupled together and may be used separately. In one configuration, the stand-alone platform 502 may contain photoresist stripping reactors and wet cleaning modules that perform post-etch processing.

The atmospheric platform 502 comprises a central atmospheric transfer chamber 510 containing a substrate handling device 512, such as a robot. Directly attached to the atmospheric transfer chamber 510 is a substrate wet cleaning module 550, an integrated particle monitor 552 and a critical dimension (CD) measuring tool 554, and a photoresist stripping chamber 517. A dry clean module (not shown) can also be attached to the atmospheric transfer chamber 510, if desired. Each module or tool is coupled to the transfer chamber 510 by a separately closable and sealable opening, such as a slit valve. The transfer chamber is maintained at substantially atmospheric pressure during operation. The substrate handling device 512 is able to transfer substrates from one module or tool to another module or tool that is attached to the atmospheric transfer chamber 510. In the embodiment shown, the substrate handling device 512 is a dual blade, single arm, single wrist robot. Other types of robots may be used to access the various modules and tools.

The atmospheric transfer chamber 510 is coupled to at least one substrate input/output module 520 that provides and receives substrates to and from the platform 500. In one embodiment of the platform 500, the module 520 comprises at least one front opening unified pod (FOUP). Two FOUPs 522 and 524 are depicted. The substrate handling device 512 accesses each FOUP through a sealable access door 521. The substrate handling device 512 moves linearly along a track 523 to facilitate access to all of the modules and tools.

The atmospheric transfer chamber 510 is coupled to the pair of load locks 506 and 508 through sealable doors 505 and 509 such that the substrate handling device 512 can access the load locks 506 and 508. The sub-atmospheric platform 504 comprises a central sub-atmospheric transfer chamber 530 and a plurality of process chambers 556, 558, 560, and 562. Sealable doors 507 and 511 respectively couple each load lock 506 and 508 to the sub-atmospheric transfer chamber 530. The sub-atmospheric transfer chamber 530 contains a substrate handing device 532, such as a robot (not shown), that accesses the load locks 506 and 508 as well as the process chambers 556, 558, 560 and 562.

The process chambers 556, 558, 560 and 562 are each coupled to the sub-atmospheric transfer chamber 530 via separately closable and sealable openings, such as slit-valves. The process chambers 556, 558, 560 and 562 may comprise one or more processing chambers such as the DPS I or DPS II chamber. Additionally, one or more photoresist stripping chambers such as the AXIOM® chamber described above may be used as one or more of the process chambers 556, 558, 560 and 562. As also described above, the AXIOM® chamber, if used, may be located either on the sub-atmospheric platform 504 or the atmospheric platform 502. FIG. 5 shows the sub-atmospheric platform 504 comprising two DPS I chambers 556 and 562 and two AXIOM® chambers 558 and 560. The sub-atmospheric platform 504 is, for example, a CENTURA® platform available from Applied Materials, Inc. of Santa Clara, Calif.

The platform 500 also includes a system computer 570 that is coupled to and controls each module that is coupled to the atmospheric and sub-atmospheric platforms 502 and 504, controls the substrate handling devices 512 and 532, and controls the load locks 506 and 508. Generally, the system computer 570 controls all aspects of operation of the platform 500 either by direct control of the sub-systems, modules, tools and apparatus or by controlling the computers associated with those sub-systems, modules, tools and apparatus. The system computer 570 enables feedback from one module or tool to be used to control the flow of substrates through the platform 500 and/or control the processes or operation of the various modules and tools to optimize substrate throughput.

The invention may be practiced in other semiconductor systems wherein the processing parameters may be adjusted to achieve acceptable characteristics by those skilled in the arts by utilizing the teachings disclosed herein without departing from the spirit of the invention.

Although the forgoing discussion referred to fabrication of the MRAM device, fabrication of the other structures and features used in the integrated circuits and devices can benefit from the invention.

While foregoing is directed to the illustrative embodiment of the present invention, other and further embodiments of the invention may be devised without departing from the basic scope thereof, and the scope thereof is determined by the claims that follow.

What is claimed is:

1. A method of fabricating a magneto-resistive random access memory (MRAM) device from a film stack comprising a top electrode layer, a free magnetic layer, a tunnel layer, a magnetic film stack, a bottom electrode layer, and a barrier layer that are formed on a semiconductor substrate, comprising:

(a) forming a first patterned mask on the film stack to define the device;

(b) etching the top electrode layer and the free magnetic layer wherein said etching produces a first residue;

(c) stripping the first residue using a gas comprising a fluorine containing gas and a hydrogen containing gas;

(d) forming a second patterned mask on the film stack to define the device;

(e) etching the magnetic film stack and the bottom electrode wherein said etching produces a second residue; and (f) stripping the second residue using a gas comprising a fluorine containing gas and a hydrogen containing gas.

2. The method of claim 1 wherein:

the first and the second masks comprise $SiO_2$;

the top electrode comprises at least one of Ta and TaN;

the free magnetic layer comprises at least one of NiFe or CoFe;

the tunnel layer comprises $Al_2O_3$;

the magnetic film stack comprises at least one of NiFe, Ru, CoFe, PtMn, IrMn, NiFe, and NiFeCr;

the bottom electrode comprises at least one of Ta and TaN; and the barrier layer comprises at least one of $SiO_2$ or $Si_3N_4$.

3. The method of claim 1 wherein the step (c) further comprises:

etching the tunnel layer.

4. The method of claim 1 wherein the step (c) further comprises:

stripping the first patterned mask.

5. The method of claim 1 wherein the step (f) further comprises:

etching the barrier layer.

6. The method of claim 2 wherein the step (f) further comprises:

stripping the second patterned mask.

7. The method of claim 1 wherein the steps (c) and (f) further comprise:

energizing the gas to a plasma.

8. The method of claim 7 wherein the plasma is a radio-frequency plasma having a frequency of about 200 to 600 kHz.

9. The method of claim 1 wherein the steps (c) and (f) use the fluorine containing gas comprising at least one of $CF_4$ and $NF_3$, and use the hydrogen containing gas comprising at least one of water ($H_2O$) vapor and $NH_3$.

10. The method of claim 9 wherein the steps (c) and (f) further comprise:

providing $CF_4$ and $H_2O$ at a flow ratio $CF_4$: $H_2O$ in a range from 1:10 to 10:1; applying radio-frequency power between about 1000 and 2000 W at about 200 to 600 kHz; and maintaining a gas pressure in a range from about 1 to 5 Torr.

* * * * *